(12) United States Patent
Chuang

(10) Patent No.: US 8,772,103 B2
(45) Date of Patent: Jul. 8, 2014

(54) LOW TEMPERATURE IMPLANT SCHEME TO IMPROVE BJT CURRENT GAIN

(75) Inventor: Ming-Yeh Chuang, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/246,362

(22) Filed: Sep. 27, 2011

(65) Prior Publication Data

US 2012/0100680 A1   Apr. 26, 2012

Related U.S. Application Data

(60) Provisional application No. 61/406,364, filed on Oct. 25, 2010.

(51) Int. Cl.
*H01L 21/8249* (2006.01)

(52) U.S. Cl.
USPC .................................. 438/234; 257/E21.696

(58) Field of Classification Search
USPC ................. 438/204, 234, 366, 531, 909, 923; 257/E21.695
See application file for complete search history.

(56) References Cited

U.S. PATENT DOCUMENTS 5,244,820 A  *  9/1993  Kamata et al. ............... 438/514
6,030,864 A      2/2000  Appel et al.

FOREIGN PATENT DOCUMENTS

KR   1020100074625 A   7/2010

* cited by examiner

*Primary Examiner* — Chandra Chaudhari
(74) *Attorney, Agent, or Firm* — Jacqueline J. Garner; Frederick J. Telecky, Jr.

(57) ABSTRACT

A process of forming an integrated circuit containing an npn BJT and an NMOS transistor by cooling the integrated circuit substrate to 5° C. or colder and concurrently implanting n-type dopants, at a specified minimum dose according to species, into the emitter region of the BJT and the source and drain regions of the NMOS transistor. A process of forming an integrated circuit containing a pnp BJT and a PMOS transistor by cooling the integrated circuit substrate to 5° C. or colder and concurrently implanting p-type dopants, at a specified minimum dose according to species, into the emitter region of the BJT and the source and drain regions of the PMOS transistor. A process of forming an integrated circuit containing an implant region by cooling the integrated circuit substrate to 5° C. or colder and implanting atoms, at a specified minimum dose according to species, into the implant region.

6 Claims, 3 Drawing Sheets

US 8,772,103 B2

LOW TEMPERATURE IMPLANT SCHEME TO IMPROVE BJT CURRENT GAIN

FIELD OF THE INVENTION

This invention relates to the field of integrated circuits. More particularly, this invention relates to ion implanted layers in integrated circuits.

BACKGROUND OF THE INVENTION

An integrated circuit may contain an npn bipolar junction transistor (BJT) and an n-channel metal oxide semiconductor (NMOS) transistor, for example to provide analog functions and logic functions, respectively. Source and drain regions of the NMOS transistor and the emitter region of the npn BJT may be formed concurrently to reduce fabrication costs. Process steps for forming the source and drain regions and the emitter region may include ion implanting arsenic at a dose above $6 \times 10^{13}$ atoms/cm$^2$, for example to attain a desired resistance in the NMOS transistor. The ion implanted arsenic may form end-of-range defects, sometimes referred to as dislocation loops, at a density higher than $1 \times 10^7$ defects/cm$^2$, in the emitter region. The end-of-range defects may adversely affect performance of the npn BJT, for example by reducing current gain, also referred to as $h_{fe}$. Subsequent thermal anneals may not be sufficient to reduce the end-of-range defects to a desired level, because attaining desired levels of performance and yield in instances of the NMOS transistor may be achieved by limiting the total thermal profile of the integrated circuit after the arsenic ion implant step. Other devices in an integrated circuit which receives an ion implant at a dose which produces more than $1 \times 10^7$ end-of-range defects/cm$^2$, for example to provide electrically active dopants or to amorphize the substrate of the integrated circuit, may experience degradation of performance parameters due to the end-of-range defects.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing an npn BJT and an NMOS transistor may be formed by cooling the substrate of the integrated circuit to 5° C. or colder and ion implanting arsenic concurrently into the emitter region of the npn BJT and the source and drain regions of the NMOS transistor through an implant screen dielectric layer, at a dose of at least $6 \times 10^{13}$ atoms/cm$^2$. An integrated circuit containing a pnp BJT and a p-channel metal oxide semiconductor (PMOS) transistor may be formed by cooling the substrate of the integrated circuit to 5° C. or colder and ion implanting gallium and/or indium concurrently into the emitter region of the pnp BJT and the source and drain regions of the PMOS transistor through an implant screen dielectric layer, at a dose of at least $6 \times 10^{13}$ atoms/cm$^2$. An integrated circuit containing an ion implanted region may be formed by cooling the substrate of the integrated circuit to 5° C. or colder and ion implanting a species into the implanted region through an implant screen dielectric layer, at a dose which would produce at least $1 \times 10^7$ end-of-range defects/cm$^2$ in a substrate cooled between 20 and 25° C.

DETAILED DESCRIPTION

Figure 1:
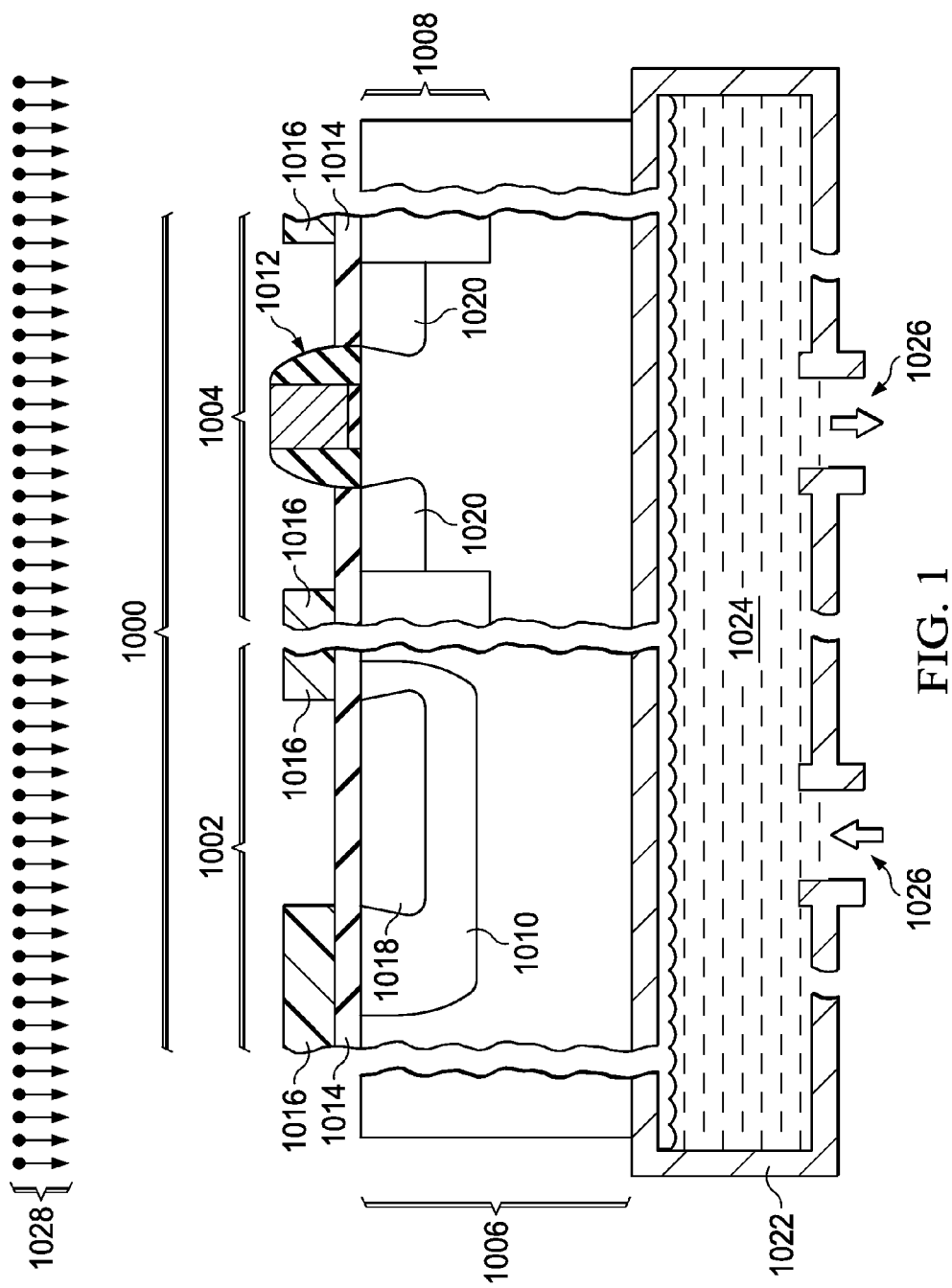
FIG. 1 depicts a process of forming an integrated circuit according to either of the first or second embodiments.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and processes are set forth to provide an understanding of the invention. One skilled in the relevant art, however, will readily recognize that the invention can be practiced without one or more of the specific details or with other processes. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit may be formed by cooling a substrate of the integrated circuit to 5° C. or colder, and ion implanting a species through an implant screen dielectric layer into a region of the substrate at a dose which would produce at least $1 \times 10^7$ end-of-range defects/cm$^2$ in a substrate cooled between 20 and 25° C.

In an embodiment, the ion implant step may include implanting boron at a dose of at least $1 \times 10^{16}$ atoms/cm$^2$. In another embodiment, the ion implant step may include implanting phosphorus at a dose of at least $8 \times 10^{14}$ atoms/cm$^2$. In a further embodiment, the ion implant step may include implanting gallium at a dose of at least $7 \times 10^{13}$ atoms/cm$^2$. In yet another embodiment, the ion implant step may include implanting germanium at a dose of at least $6 \times 10^{13}$ atoms/cm$^2$. In a further embodiment, the ion implant step may include implanting arsenic at a dose of at least $6 \times 10^{13}$ atoms/cm$^2$. In another embodiment, the ion implant step may include implanting indium at a dose of at least $6 \times 10^{13}$ atoms/cm$^2$. In a further embodiment, the ion implant step may include implanting antimony at a dose of at least $6 \times 10^{13}$ atoms/cm$^2$.

In a first embodiment, an integrated circuit containing an npn BJT and an NMOS transistor may be formed by cooling the substrate of the integrated circuit to 5° C. or colder and ion implanting phosphorus, arsenic and/or antimony, at the doses listed above, concurrently into the emitter region of the npn BJT and the source and drain regions of the NMOS transistor through an implant screen dielectric layer.

In a second embodiment, an integrated circuit containing a pnp BJT and a p-channel metal oxide semiconductor (PMOS) transistor may be formed by cooling the substrate of the integrated circuit to 5° C. or colder and ion implanting boron, gallium and/or indium, at the doses listed above, concurrently into the emitter region of the pnp BJT and the source and drain regions of the PMOS transistor through an implant screen dielectric layer.

In a third embodiment, an integrated circuit containing an implant region may be formed by cooling the substrate of the integrated circuit to 5° C. or colder and ion implanting boron, phosphorus, gallium, germanium, arsenic, indium and/or antimony, st the doses listed above, into the implant region through an implant screen dielectric layer.

FIG. 1 depicts a process of forming an integrated circuit according to either of the first or second embodiments. An integrated circuit 1000 includes a region defined for a BJT 1002 and a region defined for a metal oxide semiconductor (MOS) transistor 1004. In the first embodiment, the BJT 1002 is an npn BJT and the MOS transistor 1004 is an NMOS transistor. In the second embodiment, the BJT 1002 is a pnp BJT and the MOS transistor 1004 is a PMOS transistor. The integrated circuit 1000 is formed in and on a substrate 1006 which includes a silicon top region 1008. The substrate 1006 may be a single crystal silicon wafer, a silicon-on-insulator (SOI) wafer, a hybrid orientation technology (HOT) wafer with silicon regions of different crystal orientations, or other structure with a silicon top region 1008 appropriate for fabrication of the integrated circuit 1000.

The BJT 1002 includes a base diffused region 1010 in the silicon top region 1008. In the first embodiment, the base diffused region 1010 is p-type. In the second embodiment, the base diffused region 1010 is n-type. The MOS transistor 1004 includes a gate structure 1012, which contains a gate and a gate dielectric layer, and possibly gate sidewall spacers. Lightly doped drain (LDD) regions, not shown, may be formed at a top surface of the substrate 1006 adjacent to the gate. An implant screen dielectric layer 1014 is formed over the top surface of the substrate 1006. The implant screen dielectric layer 1014 is at least 5 nanometers thick. In one embodiment, the implant screen dielectric layer 1014 may be at least 15 nanometers thick. The implant screen dielectric layer 1014 may or may not extend to lateral edges of the substrate 1006. In one embodiment, the implant screen dielectric layer 1014 may include at least 80 percent silicon dioxide. The silicon dioxide may be formed by thermal oxidation of silicon at the top surface of the substrate 1006, may be deposited on the substrate 1006 for example by decomposition of tetraethyl orthosilicate, also known as tetraethoxysilane or TEOS, or may be formed by another process.

An implant mask 1016 is formed over the implant screen dielectric layer 1014 so as to expose an emitter region 1018 in the BJT 1002 and to expose source and drain regions 1020 in the MOS transistor 1004. The implant mask 1016 may be formed of photoresist or other photosensitive polymer using photolithographic processes, or may me formed of other dielectric material, for example by masking and etching processes.

A back surface of the substrate 1006 contacts a substrate chuck 1022. The substrate chuck 1022 is cooled to 5° C. or colder, for example by flowing a coolant fluid 1024 through the substrate chuck 1022, as indicated in FIG. 1 by coolant flow arrows 1026, until the substrate 1006 is cooled to 5° C. or colder. Other means of cooling the substrate chuck 1022 are within the scope of the instant embodiments.

While the substrate 1006 is cooled to 5° C. or colder, an ion implant process 1028 is performed which implants dopant species into the emitter region 1018 and the source and drain regions 1020. In the first embodiment, the ion implant process 1028 may implant phosphorus at a dose of at least $8 \times 10^{14}$ atoms/cm$^2$, and/or may implant arsenic at a dose of at least $6 \times 10^{13}$ atoms/cm$^2$, and/or may implant antimony at a dose of at least $6 \times 10^{13}$ atoms/cm$^2$. In one version of the first embodiment, the ion implant process 1028 may implant arsenic at a dose of at least $4 \times 10^{14}$ atoms/cm$^2$. In another version of the first embodiment, the ion implant process 1028 may implant arsenic at a dose of at least $1 \times 10^{15}$ atoms/cm$^2$. In the second embodiment, the ion implant process 1028 may implant boron at a dose of at least $1 \times 10^{16}$ atoms/cm$^2$ and/or may implant gallium at a dose of at least $7 \times 10^{13}$ atoms/cm$^2$ and/or may implant indium at a dose of at least $6 \times 10^{13}$ atoms/cm$^2$. In one version of the first and second embodiments, silicon substrate material in the silicon top region 1008 in into the emitter region 1018 and the source and drain regions 1020 may be amorphized at the top surface of the substrate 1006 to a depth of at least 15 nanometers. Forming the emitter region 1018 as described in reference to FIG. 1 may provide a BJT 1002 with an improved $h_{fe}$ compared to a similar BJT formed using an emitter implant process with a same dose and energy during which the substrate is cooled to 20° C. to 25° C.

Figure 2:
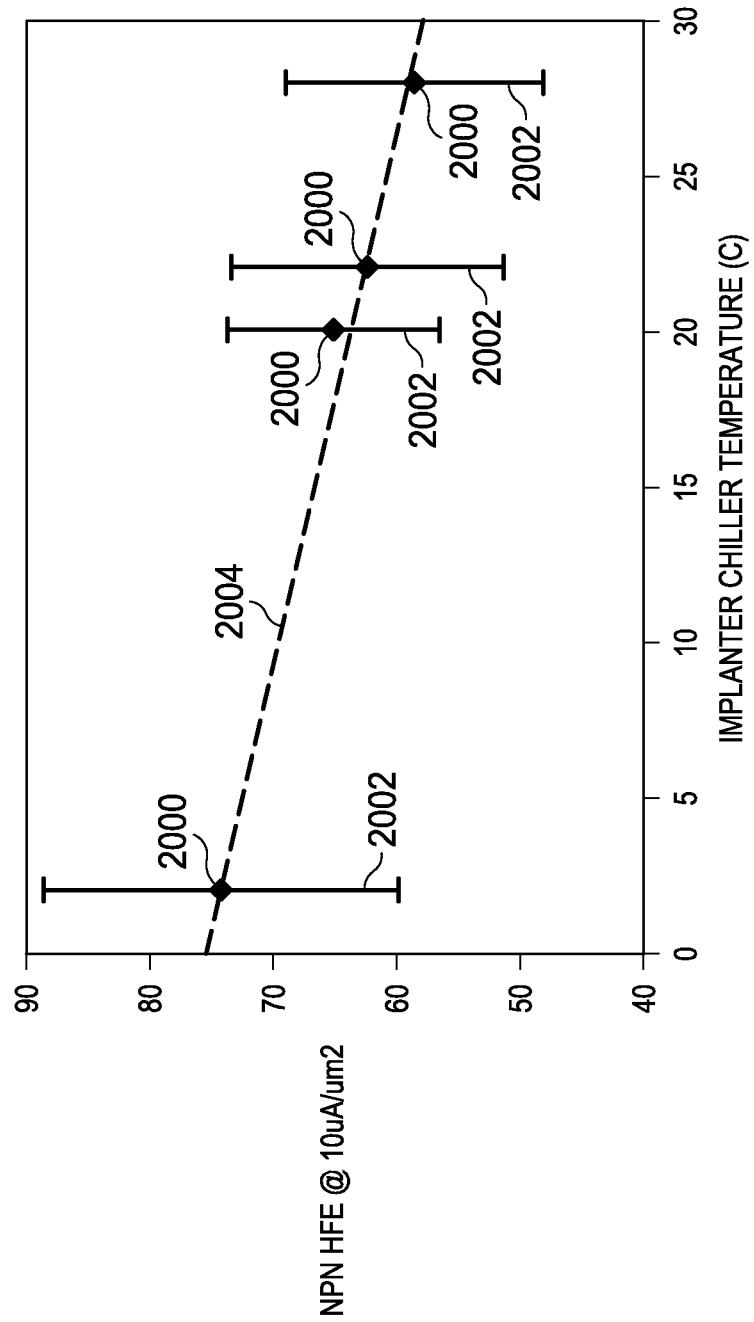
FIG. 2 is a chart showing improvement of $h_{fe}$ in an npn BJT as a function of substrate temperature.

FIG. 2 shows improvement of $h_{fe}$ in an npn BJT as a function of substrate temperature, noted in FIG. 2 as "Implanter Chiller Temperature." Average data points 2000 depict average values of $h_{fe}$ of a set of npn BJTs formed with emitter implants as described in reference to FIG. 1. Range bars 2002 depict limits of +/−3 standard deviations of $h_{fe}$ values at each substrate temperature value. Trend line 2004 is provided as a guide to estimating $h_{fe}$ values by interpolation.

Figure 3:
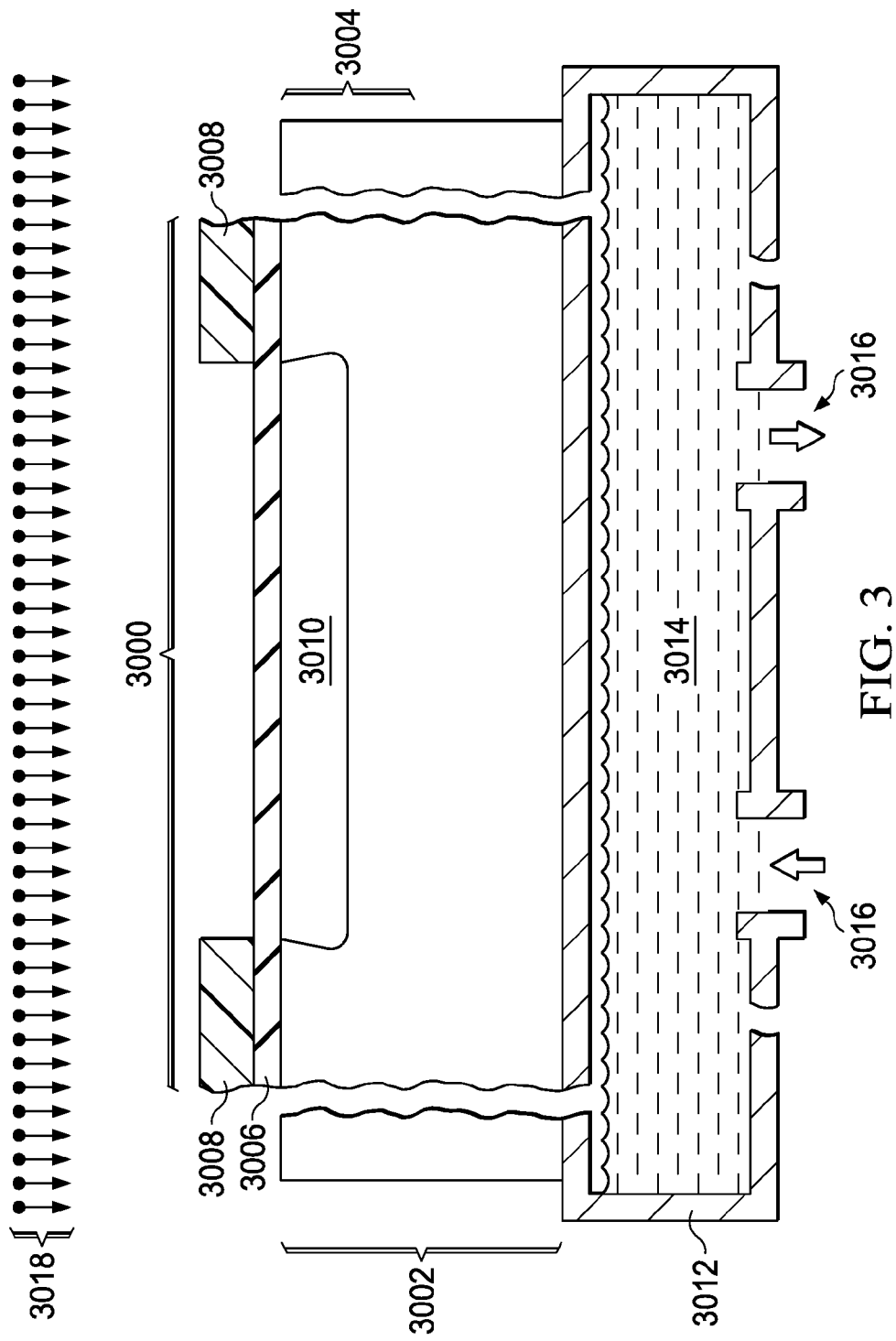
FIG. 3 depicts a process of forming an integrated circuit according to the third embodiment.

FIG. 3 depicts a process of forming an integrated circuit according to the third embodiment. An integrated circuit 3000 is formed in and on a substrate 3002 which includes a silicon top region 3004. The substrate 3002 and silicon top region 3004 have properties of the substrate 1006 and silicon top region 1008 as described in reference to FIG. 1. An implant screen dielectric layer 3006 is formed over a top surface of the substrate 3002. The implant screen dielectric layer 3006 has properties of the implant screen dielectric layer 1014 as described in reference to FIG. 1. An implant mask 3008 is formed over the implant screen dielectric layer 3006 so as to expose an implant region 3010 in the integrated circuit 3000. The implant mask 3008 has properties of the implant mask 1016 as described in reference to FIG. 1.

A back surface of the substrate 3002 contacts a substrate chuck 3012. The substrate chuck 3012 is cooled to 5° C. or colder, for example by flowing a coolant fluid 3014 through the substrate chuck 3012, as indicated in FIG. 3 by coolant flow arrows 3016, until the substrate 3002 is cooled to 5° C. or colder. Other means of cooling the substrate chuck 3012 are within the scope of the instant embodiments.

While the substrate 3002 is cooled to 5° C. or colder, an ion implant process 3018 is performed which implants one or more dopant and/or amorphizing atom species into the implant region 3010. In the instant (third) embodiment, the ion implant process 3018 may implant boron at a dose of at least $1 \times 10^{16}$ atoms/cm$^2$, and/or may implant phosphorus at a dose of at least $8 \times 10^{14}$ atoms/cm$^2$, and/or may implant gallium at a dose of at least $7 \times 10^{13}$ atoms/cm$^2$, and/or may implant germanium at a dose of at least $6 \times 10^{13}$ atoms/cm$^2$, and/or may implant arsenic at a dose of at least $6 \times 10^{13}$ atoms/cm$^2$, and/or may implant indium at a dose of at least $6 \times 10^{13}$ atoms/cm$^2$, and/or may implant antimony at a dose of at least $6 \times 10^{13}$ atoms/cm$^2$. In one version of the instant (third) embodiment, silicon substrate material in the silicon top region 3004 in the implant region 3010 may be amorphized at the top surface of the substrate 3002 to a depth of at least 15 nanometers. Forming the implant region 3010 as described in reference to FIG. 3 may result in less than $1 \times 10^7$ defects/cm$^2$, compared to a similar implant region formed using an implant process with a same dose and energy during which the substrate is cooled to 20° C. to 25° C. which results in greater than $1\times10^7$ defects/cm².

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit containing a pnp BJT and a p-channel metal oxide semiconductor (PMOS) transistor, comprising:

forming a implant screen dielectric layer over a top surface of a silicon top region of a substrate of said integrated circuit, over an emitter region of said pnp BJT and source and drain regions of said PMOS transistor;

forming an implant mask over said implant screen dielectric layer so as to expose said emitter region and said source and drain regions;

bringing said substrate of said integrated circuit in contact with a substrate chuck;

cooling said substrate chuck so that said substrate of said integrated circuit is cooled to a temperature of 5° C. or colder; and while said substrate is cooled to 5° C. or cooler, ion implanting p-type dopants concurrently into said emitter region and said source and drain regions, in which said p-type dopants and a dose of said p-type dopants are selected from the group consisting of boron at a dose of at least $1\times10^{16}$ atoms/cm², gallium at a dose of at least $7\times10^{13}$ atoms/cm², indium at a dose of at least $6\times10^{13}$ atoms/cm², and any combination thereof.

2. The process of claim 1, in which said implant screen dielectric layer includes at least 80 percent silicon dioxide.

3. The process of claim 1, in which said implant screen dielectric layer is at least 15 nanometers thick.

4. The process of claim 1, in which said implant mask is formed of photoresist.

5. The process of claim 1, in which said step of ion implanting said p-type dopants amorphizes silicon material at said top surface of said silicon top region in said emitter region and said source and drain regions to a depth of at least 15 nanometers.

6. The process of claim 1, in which said step of cooling said substrate chuck is performed by flowing a coolant fluid through said substrate chuck.

* * * * *